(12) United States Patent
Wilson et al.

(10) Patent No.: US 8,138,526 B2
(45) Date of Patent: Mar. 20, 2012

(54) SEMICONDUCTOR STRUCTURES INCLUDING DUAL FINS

(75) Inventors: Aaron R. Wilson, Boise, ID (US); Larson Lindholm, Boise, ID (US); David Hwang, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 12/944,529

(22) Filed: Nov. 11, 2010

(65) Prior Publication Data
US 2011/0057269 A1    Mar. 10, 2011

Related U.S. Application Data

(62) Division of application No. 11/778,938, filed on Jul. 17, 2007, now Pat. No. 7,879,659.

(51) Int. Cl.
*H01L 21/76* (2006.01)
(52) U.S. Cl. . 257/213; 257/244; 257/270; 257/E21.409; 257/E29.255
(58) Field of Classification Search ............... 257/244, 257/365, E21.409, E29.255, 213, 270
See application file for complete search history.

(56) References Cited

U.S. PATENT DOCUMENTS

| | | |
|---|---|---|
| 2005/0042833 A1 | 2/2005 | Park et al. |
| 2005/0179030 A1 | 8/2005 | Seo et al. |
| 2005/0239254 A1 | 10/2005 | Chi et al. |
| 2005/0285204 A1* | 12/2005 | Kim et al. ............. 257/368 |
| 2006/0046407 A1 | 3/2006 | Juengling |
| 2006/0189043 A1 | 8/2006 | Schulz |
| 2006/0289905 A1* | 12/2006 | Kito et al. ............. 257/288 |
| 2006/0292787 A1 | 12/2006 | Wang et al. |
| 2007/0254453 A1 | 11/2007 | Ang |
| 2008/0119020 A1* | 5/2008 | Grisham et al. ........ 438/221 |

* cited by examiner

*Primary Examiner* — Julia Slutsker
(74) *Attorney, Agent, or Firm* — TraskBritt

(57) ABSTRACT

Fin-FET (fin field effect transistor) devices and methods of fabrication are disclosed. The Fin-FET devices include dual fin structures that may form a channel region between a source region and a drain region. In some embodiments, the dual fin structures are formed by thinning shallow trench isolation structures, using a pair of shallow trench isolation (STI) structures as a mask to define a recess in a portion of the substrate between the pair of STI structures, and recessing the pair of STI structures so that the resulting dual fin structure protrudes from an active surface of the substrate. The dual fin structure may be used to form single-gate, double-gate or triple-gate fin-FET devices. Electronic systems including such fin-FET devices are also disclosed.

17 Claims, 9 Drawing Sheets

US 8,138,526 B2

SEMICONDUCTOR STRUCTURES INCLUDING DUAL FINS

CROSS-REFERENCE TO RELATED APPLICATION

This application is a divisional of U.S. patent application Ser. No. 11/778,938, filed Jul. 17, 2007, now U.S. Pat. No. 7,879,659, issued Feb. 1, 2011, the disclosure of which is hereby incorporated herein by this reference in its entirety.

FIELD OF THE INVENTION

Embodiments of the present invention relate generally to methods for fabricating so-called "fin" field effect transistors, or "fin-FETs," which protrude from an active surface of a fabrication substrate, and more specifically, to methods for fabricating fin-FETs in which each protruding structure, or active-device region, includes two fins, as well as to semiconductor device structures with dual fins.

BACKGROUND

The performance of silicon-based complementary metal-oxide-semiconductor (CMOS) transistors steadily improves as device dimensions shrink. The decreasing size of metal-oxide-semiconductor field-effect transistors (MOSFET) provides improved integrated-circuit performance speed and cost per function. As channel lengths of MOSFET devices are reduced to increase both the operation speed and the number of components per chip, the source and drain regions extend towards each other, occupying the entire channel area between the source and the drain. Interactions between the source and drain of the MOSFET degrade the ability of the gate of the MOSFET to control whether the MOSFET is "on" or "off." In particular, the threshold voltage and drive current decrease appreciably with the channel length. This phenomenon is called the "short channel effect." The term "short channel effect," as used herein, refers to the limitations on electron drift characteristics and modification of the threshold voltage caused by shortening trench lengths.

Double- or tri-gate transistors, such as vertical double-gate silicon-on-insulator (SOI) transistors or fin-FETs, offer significant advantages related to high drive current and high immunity to short trench effects. Conventionally, fin-FET devices have included single, unitary semiconductor structures that protrude from an active surface of a substrate. Such a semiconductor structure is generally referred to as a "fin." A polysilicon layer may be deposited over a central portion of the fin and patterned to form a pair of gates on opposite sides of the fin. Among the many advantages offered by fin-FETs is better gate control at short gate lengths. Fin-FETs facilitate down-scaling of CMOS dimensions while maintaining acceptable performance.

With ever-decreasing semiconductor device feature sizes, the effects of shortened channel lengths become increasingly problematic in the fabrication of semiconductor devices.

Methods of fabricating semiconductor devices to reduce short channel effects and increase drive current, as well as improved fin-FET structures, are desirable.

BRIEF DESCRIPTION OF THE SEVERAL VIEWS OF THE DRAWINGS

FIGS. 3-8A are cross-sectional views of an embodiment of an intermediate semiconductor device structure of the present invention during various stages of fabrication;

DETAILED DESCRIPTION OF THE INVENTION

An embodiment of a method of the present invention for fabricating semiconductor device structures with dual fins is disclosed, as are embodiments of semiconductor device structures including dual fins. As used herein, the term "fin" includes a single, unitary semiconductor structure protruding from an active surface of a substrate. The methods disclosed herein may be used to fabricate a variety of devices such as dynamic random access memory (DRAM) devices, CMOS devices, and other devices in which fin-FETs would be suitable and increases in drive current are desired.

Reference will now be made to the figures wherein like numerals represent like elements. The figures are not necessarily drawn to scale. Elements in the figures are drawn in cross-section.

Figure 1:
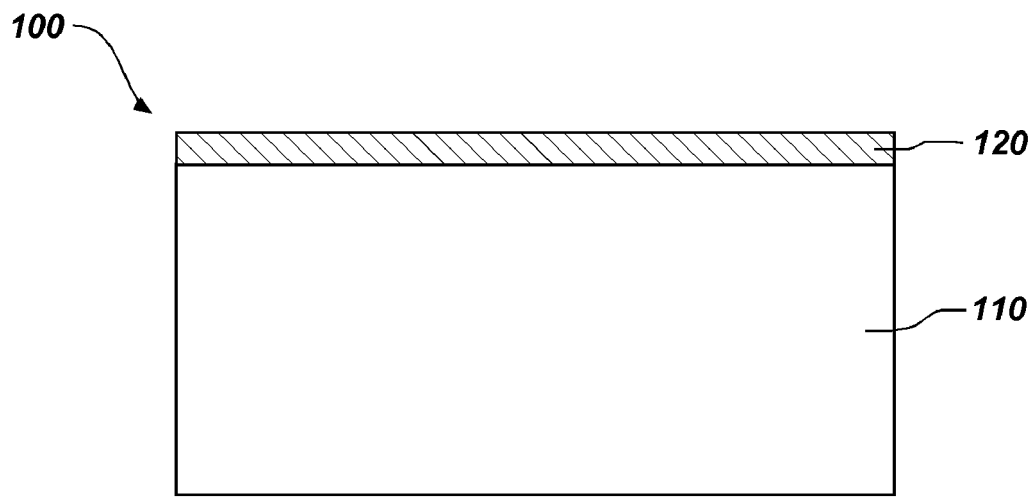
FIGS. 1 and 2A are cross-sectional views of an embodiment of an intermediate semiconductor device structure of the present invention during various stages of fabrication.

FIGS. 1-8A depict, in simplified cross-section, an embodiment of a process for forming dual fin structures on a substrate 110. As used herein, the term "substrate" includes a base material or construction in and upon which various features may be formed. Various embodiments of substrates include, but are not limited to, full or partial wafers of semiconductor material (e.g., silicon, gallium arsenide, indium phosphide, etc.) and semiconductor-on-insulator (SOI) type substrates such as silicon-on-ceramic (SOC), silicon-on-glass (SOG), and silicon-on-sapphire (SOS) substrates. In some embodiments, a semiconductor device structure 100 includes a substrate 110 and a mask layer 120, as shown in FIG. 1.

In some embodiments, a mask layer 120 may be formed on the substrate 110 by depositing a dielectric material, such as silicon nitride ($Si_3N_4$) or silicon dioxide ($SiO_2$), by conventional techniques, including, but not limited to, chemical vapor deposition (CVD), pulsed layer deposition (PLD), atomic layer deposition (ALD), and the like. In other embodiments, material of mask layer 120 may be applied and spread across (e.g., by spin-on processes) substrate 110, grown on substrate 110, or formed by other suitable techniques.

Figure 2A:
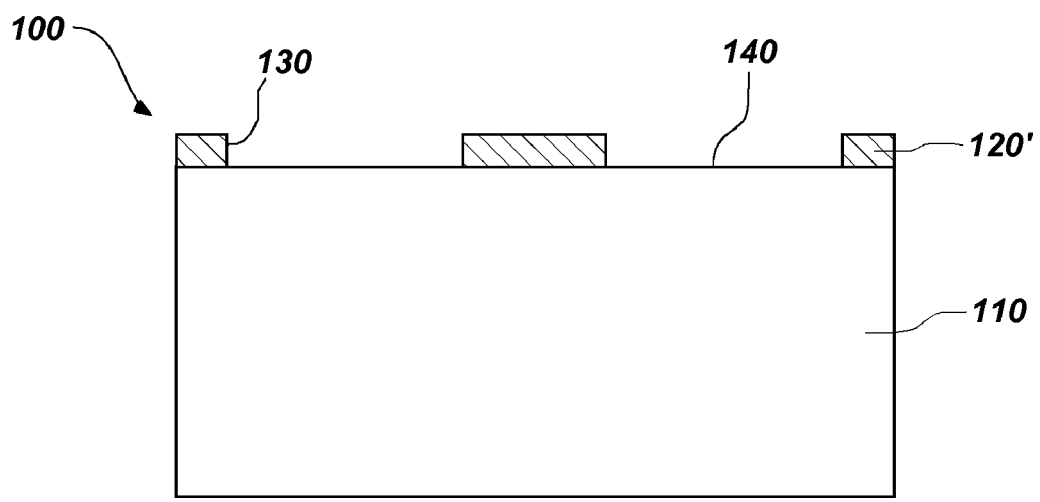

As shown in FIG. 2A, the mask layer 120 may be patterned by techniques known in the art to define a mask 120'. In some embodiments, the mask layer 120 may be patterned using known photomask forming and/or transparent carbon mask forming and etching techniques. Removal of the mask layer 120 may be used to form a mask 120' with apertures 130 through which regions 140 of the substrate 110 are exposed. The mask 120' may be defined to form multiple exposed regions 140 useful in forming an array of fin-FET devices.

Figure 2B:
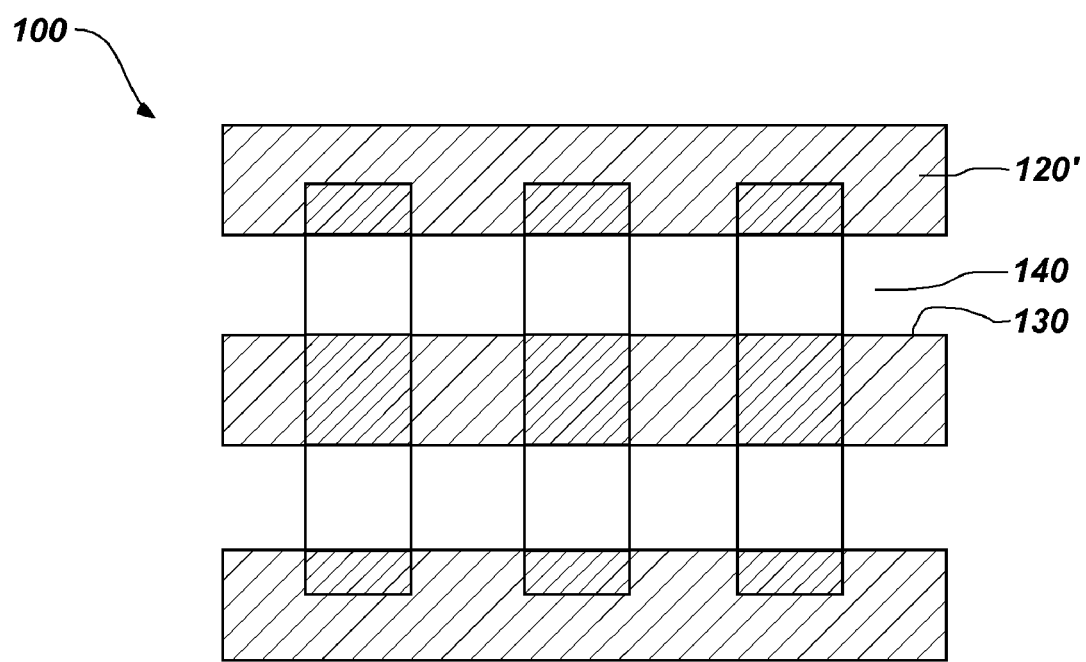
FIG. 2B is a top-down view of the embodiment of the intermediate semiconductor device structure shown in FIG. 2A.

FIG. 2B illustrates the mask 120' formed over substrate 110, with apertures 130 located over a plurality of exposed regions 140 from which semiconductor device features are to be defined.

Figure 3:
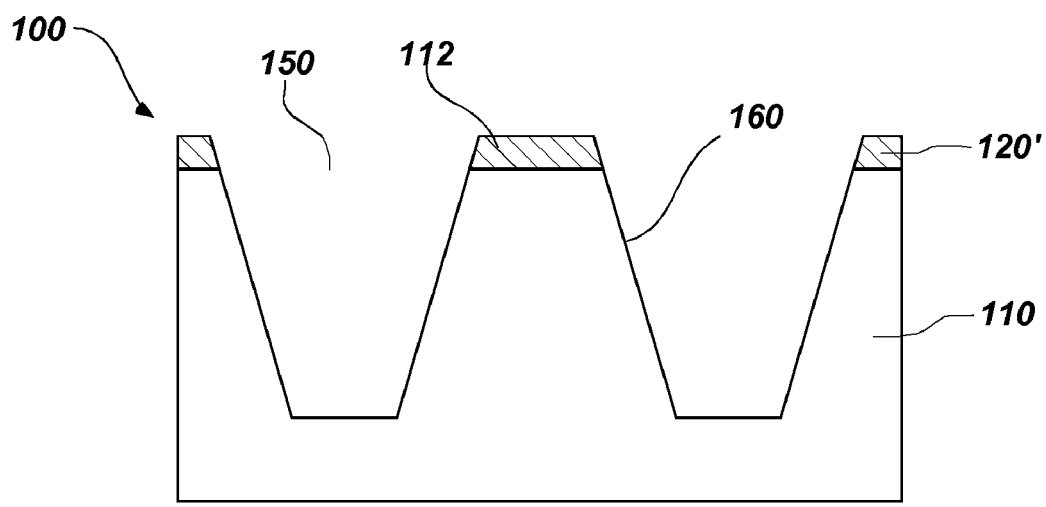

Referring to FIG. 3, trenches 150 for shallow trench isolation (STI) structures may be formed by removing material from portions of the substrate 110. In some embodiments, the trenches 150 may be formed by etching the exposed regions 140 of the substrate 110 through apertures 130 in the mask 120'. In some embodiments, the mask 120' may comprise a hard mask of silicon nitride material, and the substrate 110 may be a silicon material that is selectively etched with respect to the mask 120'. In some embodiments, an anisotropic etch (e.g., a dry plasma etch) may be used to remove substrate material to form trenches 150 with sloped or angled sidewalls 160 such as those shown in FIG. 3. In other embodiments, an isotropic etch (e.g., a wet etch) may be used to remove substrate 110 material to form trenches 150, with or without sloped or angled sidewalls 160. In some embodiments, removal of material from the substrate 110 is controlled to form trenches 150 with depths of about 140 Å to about 14,000 Å. In specific embodiments, material may be removed from the substrate to form trenches 150 with depths of about 2,500 Å.

Figure 11:
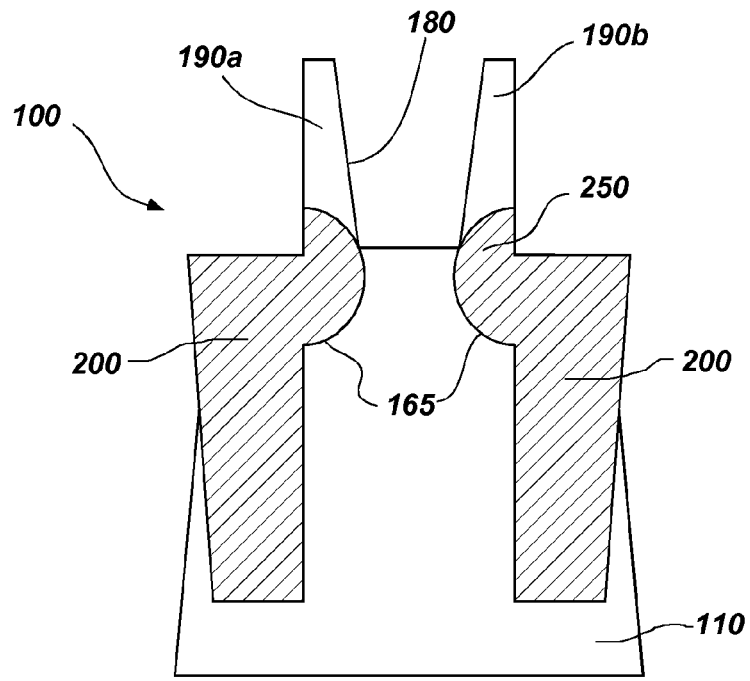
FIGS. 11-15 are cross-sectional views of various other embodiments of dual fin structures.

During the formation of trenches 150, spade-shaped recesses 165 (see FIGS. 11 and 13), which may also be characterized as generally semicircular in configuration, may optionally be formed in the trench sidewalls 160. In some embodiments, a so-called "spade etch" process may be employed as material is removed from the substrate 110 to form the trench 150 to isotropically remove portions of the substrate 110 from sidewalls 160. The recesses 165 may be formed after the trench 150 has been defined, or as an intermediate part of the process for defining the trench 150 (i.e., definition of the trench 150 may be discontinued to form the recesses 165 and, once the recesses 165 are formed, definition of the trenches 150 may continue by resuming the initial process by which material was removed from the substrate 110, or by a similar material removal process). The recess 165 may be used, as depicted in FIG. 11 and described in detail below, to form isolation regions 250 that may be useful in reducing cross-talk and leakage current through the substrate 110.

Figure 4:
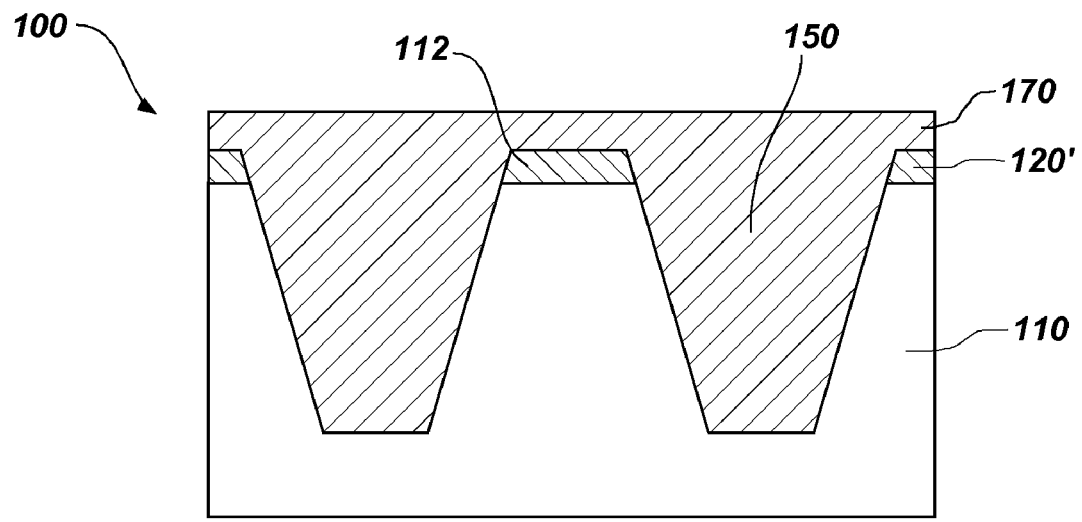

Active device areas on an active surface 112 of substrate 110 may be further isolated from one another by known shallow trench isolation (STI) techniques. As shown in FIG. 4, a dielectric material 170, such as silicon dioxide ($SiO_2$), may be applied over the active surface 112 of the substrate 110. Deposition of the dielectric material 170 may be performed by techniques known in the art, such as chemical vapor deposition (CVD) and spin-on techniques. The dielectric layer 170 overlies mask 120' and fills both trenches 150 in the substrate 110 and apertures 130 in the mask 120'. In embodiments where a spade etch is used to form spade-shaped recesses 165 in the sidewalls 160 of the trenches 150, the dielectric layer 170 fills the recesses 165, resulting in isolation structures 250 such as those shown in FIG. 11.

Figure 5:
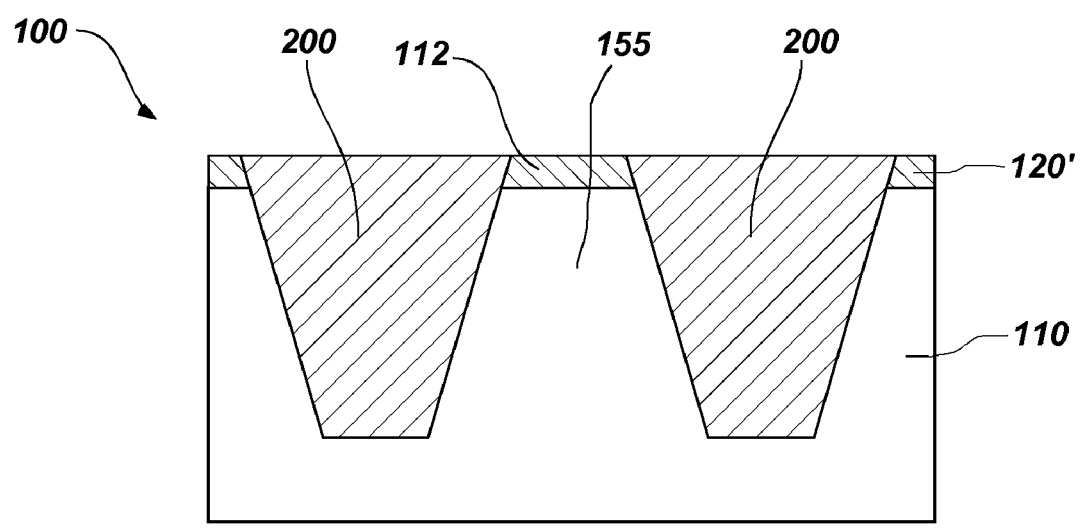

Referring to FIG. 5, a portion of the dielectric layer 170 may be removed from over the mask 120' to expose the mask 120' and to separate the newly formed STI structures 200 from one another. In some embodiments, a chemical-mechanical polishing (CMP) process may be used to remove the dielectric layer 170 that overlies the mask layer 120 so that an upper surface of each resulting STI structure 200 is substantially coplanar, or level, with the upper surface of the mask 120'. In such embodiments, the mask 120' may comprise a material that is removed at a lower rate during polishing than the material of the dielectric layer 170 and may, therefore, be used as a CMP-stop layer to prevent removal of material covered by the mask 120'. Where the STI structures 200 include silicon dioxide, the mask 120' may include silicon nitride. In other embodiments, the dielectric layer 170 may be selectively removed (e.g., etched) to expose the mask 120', which may serve as an etch stop. The resulting semiconductor device structure 100 includes an exposed mask 120' in the form of a hard mask on protruding regions 155 of the active surface 112 of the substrate 110 that are located between a pair of STI structures 200.

Figure 6:
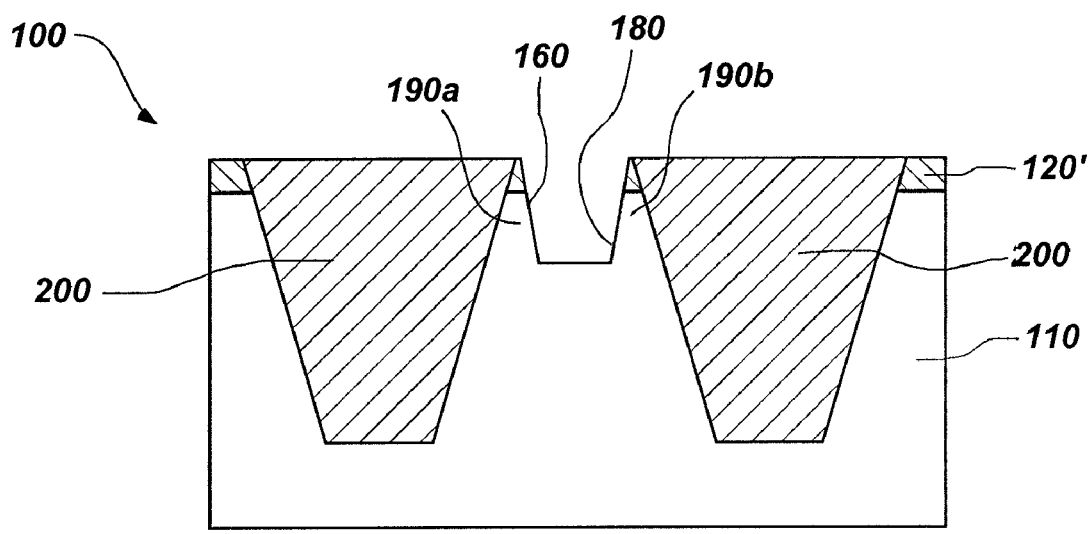

Referring to FIG. 6, a portion of the mask 120' and material of the protruding region 155 may be removed to define a recess 180 with dual fin structures 190a and 190b on opposite sides of the recess 180. A portion of the mask 120' may be removed to expose the protruding region 155 where the recess 180 will be formed. In some embodiments, material of the mask 120' may be selectively removed (e.g., etched) using the STI structures 200 as a self-aligned hard mask.

After removal of portions of the mask 120', a portion of each protruding region 155 may be removed through remaining portions of the mask 120' to define the recess 180 and the dual fin structures 190a and 190b. In some embodiments, the STI structures 200 and the mask layer 120 may be used as self-aligning hard masks in removing the substrate 110 material from each protruding region 155. In one embodiment, silicon of the substrate 110 may be selectively removed with respect to a silicon nitride of the mask 120' and silicon dioxide of the STI structures 200.

Figure 14:
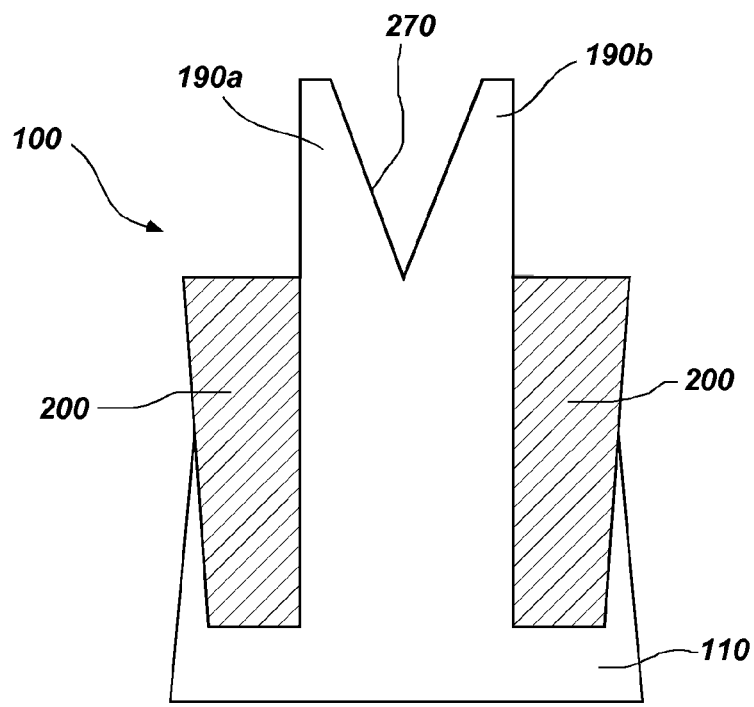
Figure 15:
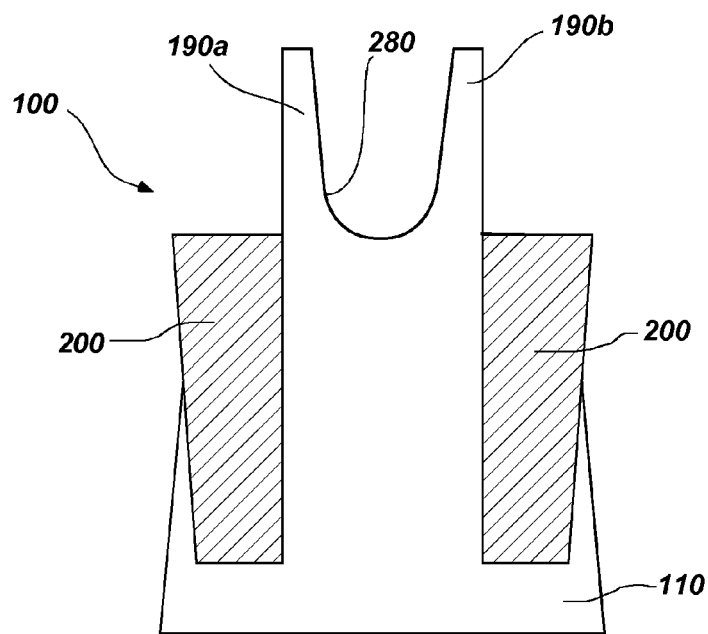

The shape and critical dimensions (CD) of the recess 180 and the dual fin structures 190a and 190b may be controlled by the process by which material is removed from each protruding region 155 of the substrate 110. In some embodiments, removal of material from the substrate 110 is performed using an anisotropic etch process, as known in the art, to form sloped or angled sidewalls 160, such those shown in FIG. 6. In some embodiments, the material of the substrate 110 may be removed to form a V-shaped recess 270, as shown in FIG. 14, or a U-shaped recess 280, as shown in FIG. 15. In some embodiments, the recess 180 extends into the substrate 110 to a depth of about 40 Å to about 4,000 Å. In a specific embodiment, the recess 180 may extend about 1,000 Å into the substrate 110.

Cross-talk and leakage current through the substrate 110 may be reduced, in additional embodiments, by electrically isolating the dual fin structures 190a and 190b from each other. The dual fin structures 190a and 190b may be at least partially isolated from the substrate 110 and from each other by forming an enlarged end 260 at the base of the recess 180 (or at the end of recess 270, 280, etc.), in the substrate 110, between and at least partially beneath the dual fin structures 190a and 190b, such as the bowl-shaped recess 180 depicted in FIG. 12. Better isolation may be obtained the further the enlarged end 260 extends beneath each of the dual fin structures 190a, 190b.

In some embodiments, the enlarged end 260 may be formed using a "bowl etch." A bowl etch may be performed as described in United States Patent Application 2006/0292787 to Wang et al., referred to herein as "Wang," which was published on Dec. 28, 2006, the disclosure of which is hereby incorporated herein by reference in its entirety. A liner, such as silicon dioxide, is formed on surfaces of the recess 180 (i.e., on the opposed surfaces of the dual fin structures 190a and 190b) while an overlying mask layer remains unlined. An anisotropic etch is used to remove a portion of the liner at the base of the recess 180, leaving liner material on sidewalls 160 of the recess 180. With remaining portions of the liner protecting the sidewalls 160 of the recess 180, an isotropic etch is performed to form a bowl-shaped region in the unlined bottom of the recess 180. Such a method results in an enlarged end 260 at the base of the recess 180.

Figure 12:
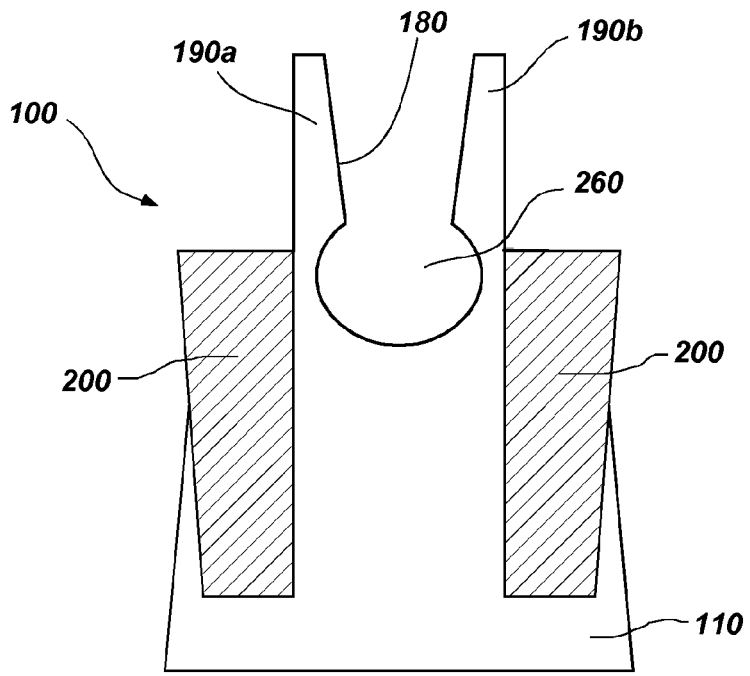
Figure 13:
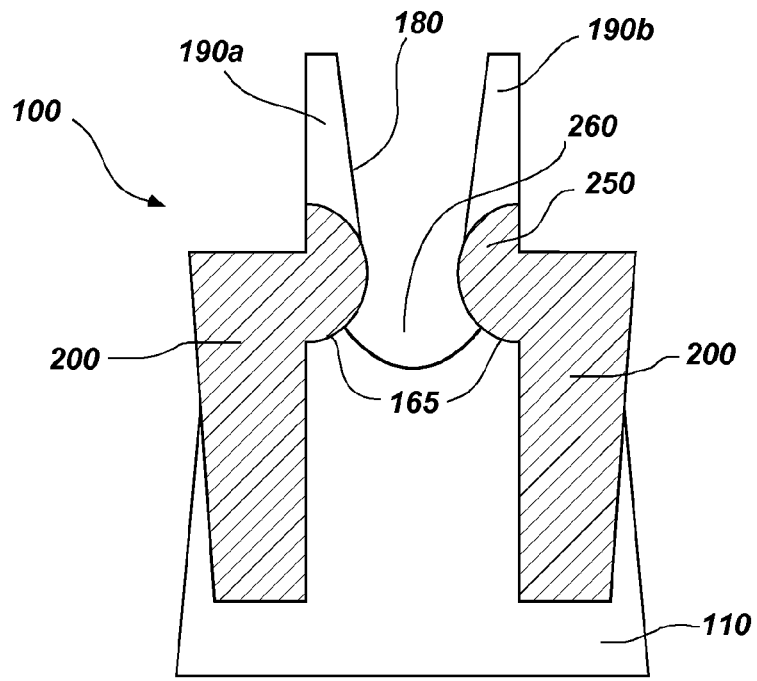

While, in the embodiment shown in FIG. 12, the dual fin structures 190a and 190b are partially electrically isolated from the substrate 110, in other embodiments, current leakage and cross-talk through the substrate 110 may be further reduced or even eliminated by further electrically isolating the dual fin structures 190a and 190b from the substrate 110. In such embodiments, a combination of a spade etch, described herein with respect to FIG. 11, and a bowl etch, described herein with respect to FIG. 12, may be employed. The spade etch may be performed subsequent to or during the formation of trenches 150 in the substrate 110. As dielectric material 170 is introduced into the trenches 150 (FIG. 4), the recesses 165 formed by the spade etch are also filled with dielectric material to form isolation extensions 250. The bowl etch may be performed after formation of the recess 180, as described above in reference to FIG. 12. Combining the etching processes results in an embodiment of a semiconductor device structure 100 in which the dual fin structures 190a and 190b are further electrically isolated from the substrate 110 and from one another, as illustrated in FIG. 13.

Figure 7:
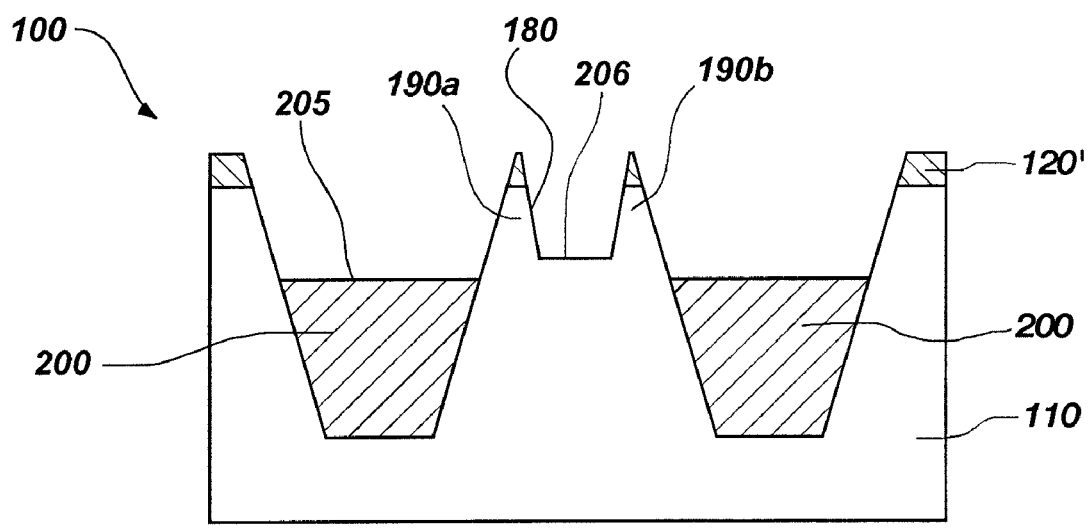

Referring now to FIG. 7, portions of the STI structures 200 are removed to expose the outer surfaces of the dual fin structures 190a and 190b. In some embodiments, the STI structures 200 are selectively etched back in relation to the mask layer 120 and the substrate 110. In some embodiments, the STI structure 200 may be recessed a depth of about 20 Å to about 20,000 Å and a width of from about 30 Å to about 50 Å at an upper surface of the STI structure 200. In some embodiments, removal of a portion of the STI structure 200 results in an upper surface 205 of the STI structure 200 that is substantially coplanar with a lower surface 206 of the recess 180. In other embodiments, an elevation (in the depicted orientation) of the upper surface 205 may be below an elevation of the lower surface 206 of the recess 180.

Figure 8A:
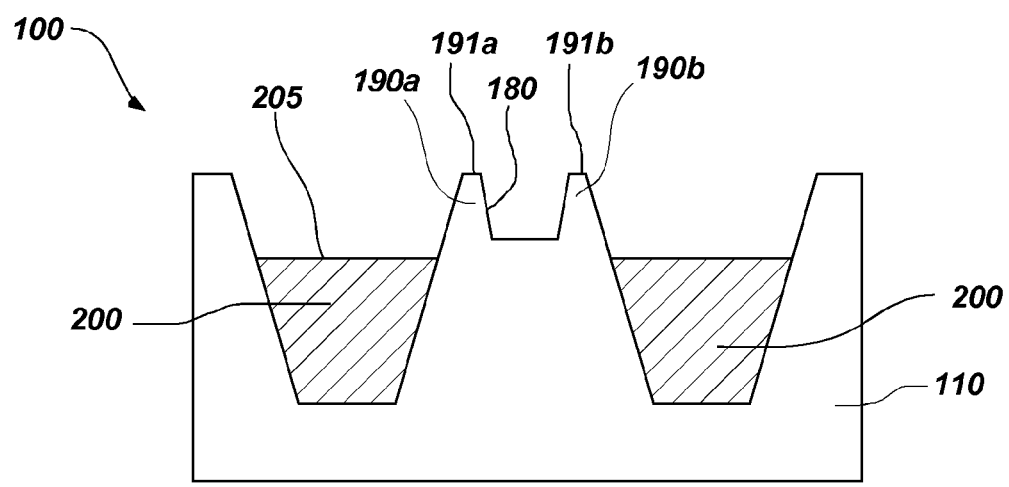
Figure 8B:
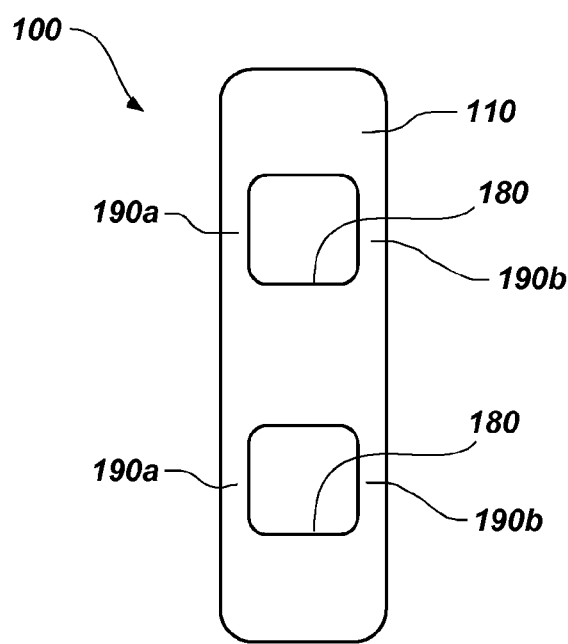
FIG. 8B is a top-down view of the embodiment of the intermediate semiconductor device structure shown in FIG. 8A.

As shown in FIG. 8A, remaining portions of the mask 120' may be removed from the upper surfaces of the dual fin structures 190a and 190b. In some embodiments, material of the mask 120' may be selectively etched over the substrate 110 and the STI structures 200. In some embodiments, removal of the mask 120' results in dual fin structures 190a and 190b with substantially planar upper surfaces 191a and 191b, such as those depicted in FIG. 8A. FIG. 8B is a top-down view of the semiconductor device structure 100, with dual fin structures 190a and 190b on opposite sides of a recess 180, as shown in FIG. 8A.

The dual fin structures 190a and 190b disclosed herein can be used to increase drive current in a DRAM device, a CMOS device or other memory devices. In various embodiments of the present invention, these and other devices may be fabricated using known processes. In some embodiments, the dual fin structures 190a and 190b may be used to form the channel regions of a semiconductor device, such as a fin-FET device.

Figure 9:
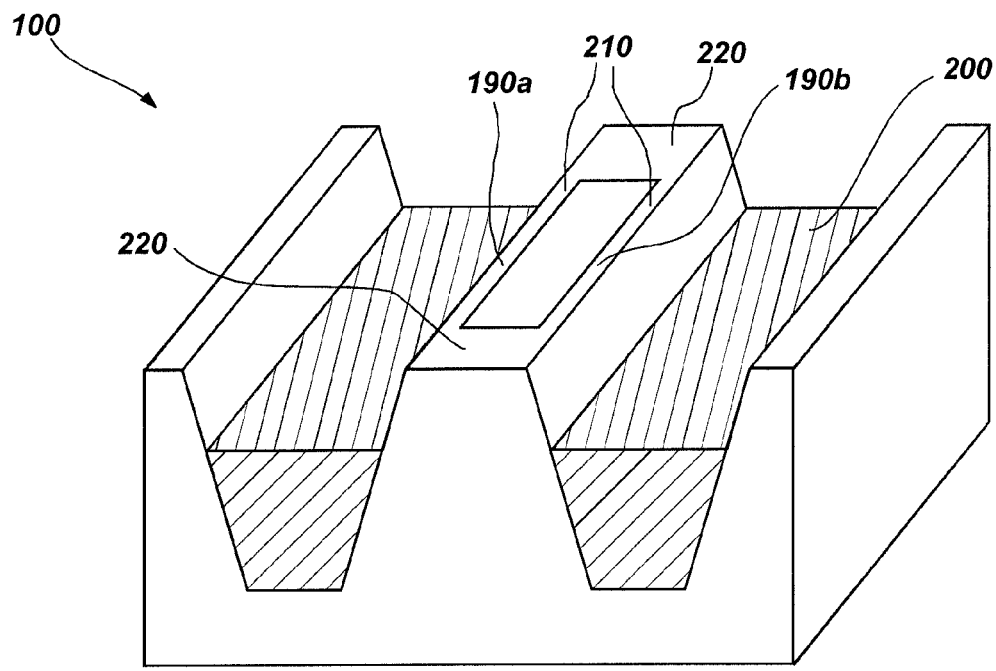
FIG. 9 is a three-dimensional representation of the embodiment of the intermediate semiconductor device structure shown in FIG. 8A.

FIG. 9 is a three-dimensional view of the semiconductor device structure 100 shown in FIG. 8A. The dual fin structures 190a and 190b form channel regions 210 extending between source/drain regions 220 with STI structures 200 providing isolation between adjacent active device regions. In some embodiments, the source/drain regions 220 of the semiconductor device structure 100 may be doped using any suitable doping process, such as ion implantation or diffusion.

Figure 10:
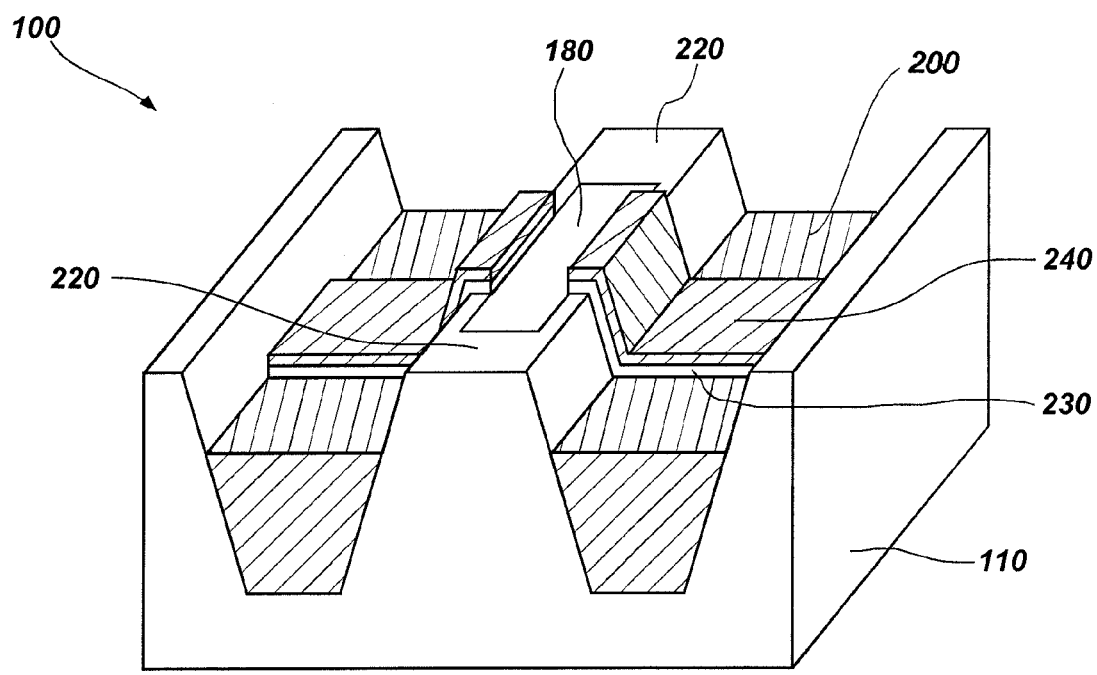
FIG. 10 is a three-dimensional representation of a fin-FET device according to an embodiment of the present invention.

Referring to FIG. 10, a gate oxide film 230 may be formed between the source/drain regions 220 on the semiconductor device structure 100 by known oxidation processes (e.g., thermal oxidation, exposure to an oxidant, etc.), deposited (e.g., by CVD, PLD, ALD, etc.), or formed by other processes known in the art. A gate electrode 240 may be formed on the gate oxide film 230 to form a transistor gate, such as that shown in FIG. 10. In some embodiments, a single-gate fin-FET may be formed by forming a continuous gate electrode 240 over the surfaces of the dual fin structures 190a and 190b and the recess 180. Other features of the fin-FET, such as dielectric and protective structures, may be formed by known processes.

In some embodiments, the semiconductor device structure 100 with dual fin structures 190a and 190b may be used to form a dual-gate fin-FET by forming separate gate electrodes 240 over at least one side of each of the dual fin structures 190a and 190b. In a specific embodiment, a gate electrode may be formed on the outer surface of both 190a and 190b to form a double-gate fin-FET (not shown). In other embodiments, a triple-gate fin-FET (not shown) may be fabricated by forming a three-gate electrode.

Figure 16:
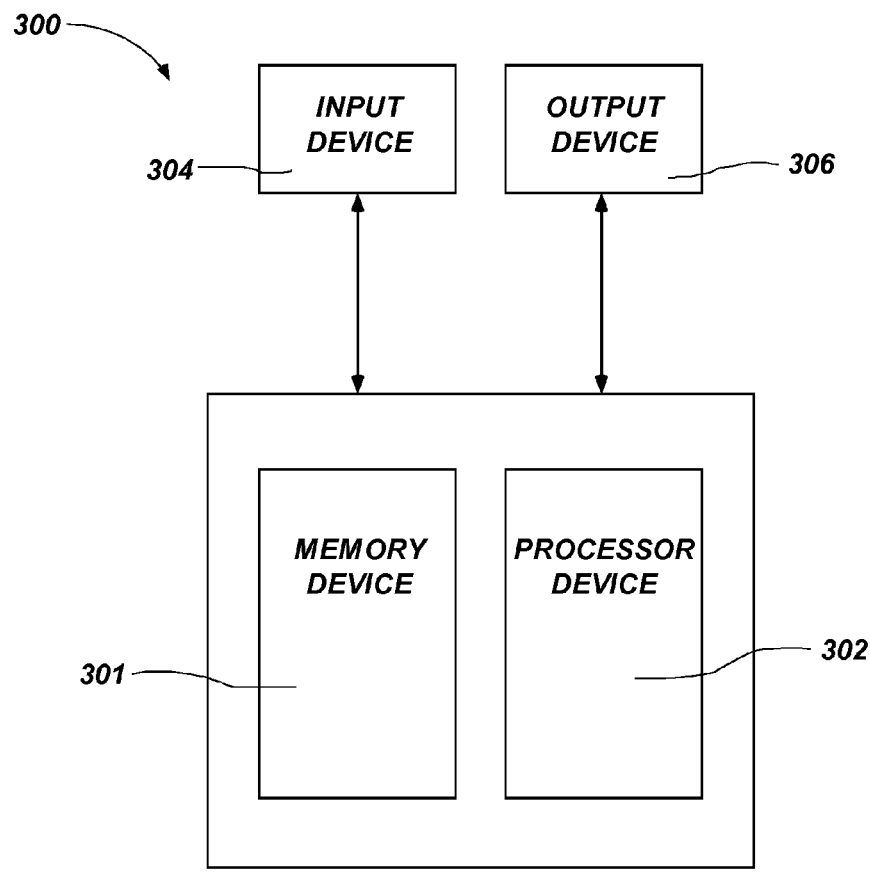
FIG. 16 is a schematic block diagram illustrating one embodiment of an electronic system of the present invention that includes a semiconductor device as described hereinbelow.

Fin-FET devices described herein may be used in embodiments of electronic systems of the present invention. For example, FIG. 16 is a block diagram of an illustrative electronic system 300 according to the present invention. The electronic system 300 may comprise, for example, a computer or computer hardware component, a server or other networking hardware component, a cellular telephone, a digital camera, a personal digital assistant (PDA), portable media (e.g., music) player, etc. The electronic system 300 includes at least one memory device 301. The electronic system 300 further may include at least one electronic signal processor device 302 (often referred to as a "microprocessor"). At least one of the electronic signal processor device 302 and the at least one memory device 301 may comprise, for example, an embodiment of the semiconductor device structure 100 shown in FIGS. 1-15. Stated another way, at least one of the electronic signal processor device 302 and the at least one memory device 301 may comprise an embodiment of a transistor having dual fins as previously described in relation to the semiconductor device structure 100. The electronic system 300 may further include one or more input devices 304 for inputting information into the electronic system 300 by a user, such as, for example, a mouse or other pointing device, a keyboard, a touchpad, a button, or a control panel. The electronic system 300 may further include one or more output devices 306 for outputting information (e.g., visual or audio output) to a user such as, for example, a monitor, a display, a printer, an audio output jack, a speaker, etc. In some embodiments, the input device 304 and the output device 306 may comprise a single touchscreen device that can be used both to input information to the electronic system 300 and to output visual information to a user. The one or more input devices 304 and output devices 306 may communicate electrically with at least one of the memory device 301 and the electronic signal processor device 302.

Although the foregoing description includes many specifics, these should not be construed as limiting the scope of the present invention but, merely, as providing illustrations of some of the presently preferred embodiments. Similarly, other embodiments of the invention may be devised which do not depart from the scope of the present invention. Features from different embodiments may be employed in combination. The scope of the invention is, therefore, indicated and limited only by the appended claims and their legal equivalents, rather than by the foregoing description. All additions, deletions and modifications to the invention as disclosed herein which fall within the meaning and scope of the claims are to be embraced thereby.

What is claimed is:

1. A semiconductor structure, comprising:
   a substrate with at least one protruding region between adjacent trenches formed therein;
   a recess in the at least one protruding region of the substrate, the recess terminating above the adjacent trenches and having a bowl-shaped lower surface, protruding fin-like structures on opposite sides of the recess;
   a semicircular opening in at least one sidewall of each of the fin-like structures, the bowl-shaped lower surface of the recess contacting the semicircular opening; and
   a dielectric material filling the adjacent trenches.

2. The semiconductor structure of claim 1, wherein the substrate comprises a silicon substrate.

3. The semiconductor structure of claim 1, wherein the adjacent trenches have sloped or angled sidewalls.

4. The semiconductor structure of claim 1, wherein the adjacent trenches extend further into the substrate than the recess.

5. The semiconductor structure of claim 1, further comprising a mask disposed over planar upper surfaces of the fin-like structures.

6. The semiconductor structure of claim 1, further comprising another dielectric material filling the semicircular opening.

7. The semiconductor structure of claim 1, wherein each of the fin-like structures is spaced apart from an underlying region of the substrate by the semicircular opening.

8. The semiconductor structure of claim 1, wherein the dielectric material comprises silicon dioxide.

9. The semiconductor structure of claim 1, wherein the dielectric material has an upper surface substantially coplanar with a lower surface of the recess.

10. The semiconductor structure of claim 1, wherein the dielectric material has an upper surface below a lower surface of the recess.

11. The semiconductor structure of claim 1, further comprising doped regions in unrecessed portions of the at least one protruding region on laterally opposite ends of the recess.

12. The semiconductor structure of claim 1, further comprising a conductive gate material extending over a portion of the dielectric material and sidewalls of the adjacent trenches, the conductive gate material terminating on ends of the fin-like structures.

13. A semiconductor structure, comprising:
    a plurality of trenches formed in a substrate and at least partially filled with a dielectric material;
    an array of recesses with fin-like structures protruding on opposite sides formed in regions of the substrate between the plurality of trenches, the fin-like structures having sloped sidewalls; and
    a mask material disposed over and terminating on surfaces at ends of the fin-like structures, sidewalls of the mask material substantially contiguous with the sloped sidewalls of the fin-like structures.

14. The semiconductor structure of claim 13, wherein an upper surface of the dielectric material is substantially coplanar with a lower surface of the array of recesses.

15. The semiconductor structure of claim 13, wherein the surfaces at the ends of the fin-like structures are substantially planar.

16. A semiconductor structure, comprising:
    at least one pair of trenches in a substrate;
    a dielectric material at least partially filling the at least one pair of trenches;
    a recessed region between the at least one pair of trenches, the recessed region having a depth less than a depth of the at least one pair of trenches, sidewalls of the recessed region and the at least one pair of trenches defining fin structures therebetween;
    an oxide material overlying a portion of the dielectric material, extending onto sidewalls of the at least one pair of trenches, and terminating on upper surfaces of the fin structures; and
    an electrode overlying the oxide material.

17. The semiconductor structure of claim 16, wherein the upper surfaces of the fin structures are substantially planar.

* * * * *